US011482659B2

(12) United States Patent
Corona et al.

(10) Patent No.: US 11,482,659 B2
(45) Date of Patent: Oct. 25, 2022

(54) COMPOSITE PIEZOELECTRIC ACTUATOR

(71) Applicant: Apple Inc., Cupertino, CA (US)

(72) Inventors: Daniel Corona, Austin, TX (US); Justin D. Crosby, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 851 days.

(21) Appl. No.: 16/217,951

(22) Filed: Dec. 12, 2018

(65) Prior Publication Data
US 2020/0098970 A1  Mar. 26, 2020

Related U.S. Application Data

(60) Provisional application No. 62/736,724, filed on Sep. 26, 2018.

(51) Int. Cl.
*H01L 41/083* (2006.01)
*H01L 41/047* (2006.01)
*H01L 41/09* (2006.01)

(52) U.S. Cl.
CPC ........ *H01L 41/083* (2013.01); *H01L 41/0471* (2013.01); *H01L 41/094* (2013.01)

(58) Field of Classification Search
CPC .. H01L 41/083; H01L 41/0471; H01L 41/094
See application file for complete search history.

(56) References Cited

U.S. PATENT DOCUMENTS

| | | | |
|---|---|---|---|
| 7,180,225 B2 | 2/2007 | Sashida et al. | |
| 7,555,133 B2 * | 6/2009 | Hama | B06B 1/0618 381/186 |
| 8,520,869 B2 * | 8/2013 | Fujise | H04R 7/18 381/190 |
| 9,107,005 B2 | 8/2015 | Kano et al. | |
| 2007/0243084 A1 | 10/2007 | Vogeley | |
| 2007/0284968 A1 * | 12/2007 | Takeuchi | H04N 5/2253 310/332 |
| 2010/0254547 A1 | 10/2010 | Grosh et al. | |
| 2011/0120843 A1 | 5/2011 | Wunnicke et al. | |

(Continued)

OTHER PUBLICATIONS

Wang, et al., "Theoretical analysis of the sensor effect of cantilever piezoelectric benders", Journal of Applied Physics, vol. 85, Feb. 1, 1999, pp. 1702-1712.

*Primary Examiner* — Bryan P Gordon
(74) *Attorney, Agent, or Firm* — Womble Bond Dickinson (US) LLP

(57) ABSTRACT

A piezoelectric actuator including an upper piezoelectric bimorph beam having a first upper piezoelectric layer, a second upper piezoelectric layer and at least three upper electrode layers extending between a first end and a second end of the upper piezoelectric bimorph beam; a lower piezoelectric bimorph beam having a first lower piezoelectric layer, a second lower piezoelectric layer and at least three lower electrode layers extending between a first end and a second end of the lower piezoelectric bimorph beam, and wherein the first end of the lower piezoelectric bimorph beam is coupled to the first end of the upper piezoelectric bimorph beam by a first joint, and the second end of the lower piezoelectric bimorph beam is coupled to second end of the upper piezoelectric bimorph beam; and a base member coupled to a center region of the lower piezoelectric bimorph beam.

25 Claims, 8 Drawing Sheets

(56) References Cited

U.S. PATENT DOCUMENTS

| | | | | |
|---|---|---|---|---|
| 2012/0057730 A1* | 3/2012 | Fujise | ................... | H04R 17/00 |
| | | | | 381/190 |
| 2012/0099746 A1* | 4/2012 | Fujise | ................... | H04R 17/00 |
| | | | | 381/190 |
| 2015/0023527 A1* | 1/2015 | Sato | ...................... | H04R 17/00 |
| | | | | 381/151 |
| 2020/0098970 A1* | 3/2020 | Corona | ................ | H01L 41/094 |

* cited by examiner

COMPOSITE PIEZOELECTRIC ACTUATOR

CROSS-REFERENCE TO RELATED APPLICATIONS

This application claims the benefit of U.S. Provisional Patent Application No. 62/736,724, filed on Sep. 26, 2018, which is incorporated herein by reference.

FIELD

An aspect of the invention is directed to a piezoelectric actuator, more specifically, a piezoelectric actuator made up of a composite structure including symmetrically stacked piezoelectric bimorph beams. Other aspects are also described and claimed.

BACKGROUND

Piezoelectric materials are solid materials upon which large mechanical stresses can be induced by applying an electric field across the material. This conversion from electrical to mechanical energy makes them useful in electromechanical actuators. However, because piezoelectric materials can be very stiff, the large stresses induced, may yield only very small strains. As a result, in their most basic bulk form, piezoelectric materials are typically only suitable for actuator applications that involve extremely small displacements (e.g., vibrations).

SUMMARY

An aspect of the disclosure is directed to a low-stiffness piezoelectric actuator unit, or composite piezoelectric actuator unit, having geometric, and bandwidth, flexibility. For example, in one aspect, the piezoelectric actuator unit, or composite piezoelectric actuator unit, is suitable for use in a mobile audio speaker driver having a desired operating frequency bandwidth and which must fit into a relatively small package geometry that other electrodynamic and/or piezoelectric drivers cannot. By way of background, it should be noted that a mechanically compliant speaker (as close as possible to the compliance of air) is necessary to drive low frequency sound efficiently. Piezoelectric speakers made of a single plate of piezoelectric material must be very thin (compared to x and y dimensions) in order to increase the compliance of the plate, enabling low frequency sound production. Since maximum output power is closely related to the volume of piezoelectric material in the actuator, such a thin plate must have very large x and y dimensions to output sufficient power, which is necessary for both low and high frequency sound output. Aspects of this disclosure therefore provide for an actuator that can output equivalent sound levels, despite widely varying aspect ratios, making fitting the actuator into a desired geometry possible. In addition, aspects of the disclosure provide for an actuator which achieves an increased electric field per volt and reduced stiffness, making it suitable for low frequency applications.

More specifically, aspects of the disclosure include a piezoelectric actuator unit or composite piezoelectric actuator unit including piezoelectric bimorph cantilever beams that are symmetrically arranged (e.g., stacked) to provide an actuator with increased displacement while still maintaining relatively small x and y dimensions. The piezoelectric bimorph cantilever beams have a relatively low stiffness, and therefore when used in the actuator, help to increase displacement. Each bimorph cantilever beam may include two layers of piezoelectric material running parallel to the beam's axis. Each layer may be sandwiched between two layers of conductive material (e.g., electrodes). A voltage or signal can be applied to the conductive layers to apply electric fields across the piezoelectric layers thereby straining the two layers. When one layer is negatively strained, and the other is positively strained, a bending moment is induced. The bending of the beam yields a potentially large displacement, particularly at the tip of the beam. When a number of piezoelectric bimorph cantilever beams are arranged together, for example, in a stacked configuration, a relatively large displacement suitable for low-frequency output (e.g., 200 Hz or less) can be achieved, without changing a thickness/stiffness of each beam (e.g., making it longer and/or thinner), and in turn, the x and y dimensions of the actuator.

Representatively, in one aspect, a piezoelectric actuator unit is disclosed. The piezoelectric actuator may include an upper piezoelectric bimorph beam, the upper piezoelectric bimorph beam having a first upper piezoelectric layer, a second upper piezoelectric layer and at least three upper electrode layers extending between a first end and a second end of the upper piezoelectric bimorph beam. The piezoelectric actuator may further include a lower piezoelectric bimorph beam coupled to the upper piezoelectric bimorph beam, the lower piezoelectric bimorph beam having a first lower piezoelectric layer, a second lower piezoelectric layer and at least three lower electrode layers extending between a first end and a second end of the lower piezoelectric bimorph beam, and the first end of the lower piezoelectric bimorph beam is coupled to the first end of the upper piezoelectric bimorph beam by a first joint, and the second end of the lower piezoelectric bimorph beam is coupled to second end of the upper piezoelectric bimorph beam. In addition, a base member may be attached to a center region of the lower piezoelectric bimorph beam along a side of the lower piezoelectric bimorph beam facing away from the upper piezoelectric bimorph beam. The base member may be dimensioned to attach the lower piezoelectric bimorph beam to a structure, and when attached, the first and second ends of the upper and lower piezoelectric bimorph beams are operable to move relative to the structure. In addition, in some aspects, each of the upper piezoelectric bimorph beam and the lower piezoelectric bimorph beam may have a same stiffness. Still further, the first upper piezoelectric layer and the second upper piezoelectric layer may be stacked in an alternating arrangement with the at least three upper electrode layers. In other aspects, the upper piezoelectric bimorph beam and the lower piezoelectric bimorph beam may bend in opposite directions upon application of a voltage. In addition, in some aspects, the first joint and the second joint may be dimensioned to be compliant to a rotational movement of the upper piezoelectric bimorph beam relative to the lower piezoelectric bimorph, and resistant to compression and tension. In addition, at least one of the first joint and the second joint may include a pressure sensitive adhesive. In some aspects, a gap in the range of 300 microns or less is present between the upper piezoelectric bimorph beam and the lower piezoelectric bimorph beam. The gap may be an open space free of a filler material. In other aspects, the structure the lower piezoelectric bimorph beam is attached to is a fixed structure, the upper piezoelectric bimorph beam is attached to a movable structure, and upon application of a voltage, the movable structure produces a sound output within a low frequency range.

In another aspect, a composite piezoelectric actuator unit is disclosed. The composite piezoelectric actuator unit may include an upper piezoelectric actuator unit including a first upper piezoelectric bimorph beam and a second upper piezoelectric bimorph beam, the first and second upper piezoelectric bimorph beams are attached to each other at each of their respective ends by a joint that allows for a rotational movement of the first upper piezoelectric bimorph beam relative to the second upper piezoelectric bimorph beam, and a base member is mounted to a center portion of the second upper piezoelectric bimorph beam along a side that faces away from the first upper piezoelectric bimorph beam. The composite piezoelectric actuator unit may further include a lower piezoelectric actuator unit attached to the upper piezoelectric actuator unit, the lower piezoelectric actuator unit may include a first lower piezoelectric bimorph beam and a second lower piezoelectric bimorph beam, the first and second lower piezoelectric bimorph beams are attached to each other at each of their respective ends by a joint that allows for a rotational movement of the first lower piezoelectric bimorph beam relative to the second lower piezoelectric bimorph beam, and a center portion of the first lower bimorph beam is mounted to the base member. In some aspects, at least one of the first upper piezoelectric bimorph beam, the second upper piezoelectric bimorph beam, the first lower piezoelectric bimorph beam or the second lower piezoelectric bimorph beam may include a stack up of a first electrode layer, a first piezoelectric layer, a second electrode layer, a second piezoelectric layer and a third electrode layer. The upper piezoelectric actuator unit and the lower piezoelectric actuator unit may be mounted together at only the base member. In still further aspects, the upper piezoelectric actuator unit and the lower piezoelectric actuator unit are symmetrically arranged. Still further, a plurality of the upper piezoelectric actuator units and a plurality of the lower piezoelectric actuator units are symmetrically attached together to achieve a desired force output without increasing an x and y dimension of the composite piezoelectric actuator unit. In addition, in some aspects, the application of a voltage causes a displacement of the upper piezoelectric actuator unit that is equal to a sum of a displacement of the upper piezoelectric actuator unit and the lower piezoelectric actuator unit combined.

In another aspect, a piezoelectric actuator assembly is disclosed. The piezoelectric actuator assembly may include (1) a movable member; (2) a first piezoelectric bimorph beam having a first piezoelectric layer and a second piezoelectric layer that are arranged between electrode layers extending from a first end to a second end of the first piezoelectric bimorph beam, wherein the first piezoelectric bimorph beam is coupled to the movable member; (3) a second piezoelectric bimorph beam having a first piezoelectric layer and a second piezoelectric layer that are arranged between electrode layers extending from a first end to a second end of the second piezoelectric bimorph beam, and wherein the first and second ends of the second piezoelectric bimorph beam are coupled to the first and second ends of the first piezoelectric bimorph beam, respectively, by a joint that allows for a rotational movement of the first and second piezoelectric bimorph beams relative to each other; (4) a base member coupled to a center portion of the second piezoelectric bimorph beam along a side of the second piezoelectric bimorph beam facing away from the first piezoelectric bimorph beam; and (5) a fixed member coupled to the base member, and wherein the first and second piezoelectric bimorph beams are operable to move the movable member relative to the fixed member upon application of a voltage. In some aspects, the first and second bimorph beams have a same thickness, length and width. In addition, the joint may include an adhesive running in a widthwise direction between the first and second ends of the first and second piezoelectric bimorph beams, and the adhesive provides the only attachment point between the first and second piezoelectric bimorph beams. In still further aspects, the base member may be a rigid base member having a compliance that is less than a compliance of the second piezoelectric bimorph beam, and the rigid base member provides the only attachment point between the second piezoelectric bimorph beam and the fixed member. In some aspects, the movable member is a speaker diaphragm and upon application of a voltage, displacement of the first and second piezoelectric bimorph beams cause the speaker diaphragm to generate a sound output with a low resonance frequency.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect in this disclosure are not necessarily to the same aspect, and they mean at least one.

DETAILED DESCRIPTION

In this section we shall explain several preferred aspects of this invention with reference to the appended drawings. Whenever the shapes, relative positions and other aspects of the parts described in the aspects are not clearly defined, the scope of the invention is not limited only to the parts shown, which are meant merely for the purpose of illustration. Also, while numerous details are set forth, it is understood that some aspects of the invention may be practiced without these details. In other instances, well-known structures and techniques have not been shown in detail so as not to obscure the understanding of this description.

The terminology used herein is for the purpose of describing particular aspects only and is not intended to be limiting of the invention. Spatially relative terms, such as "beneath", "below", "lower", "above", "upper", and the like may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

As used herein, the singular forms "a", "an", and "the" are intended to include the plural forms as well, unless the context indicates otherwise. It will be further understood that the terms "comprises" and/or "comprising" specify the presence of stated features, steps, operations, elements, and/or components, but do not preclude the presence or addition of one or more other features, steps, operations, elements, components, and/or groups thereof.

The terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps or acts are in some way inherently mutually exclusive.

Figure 1:
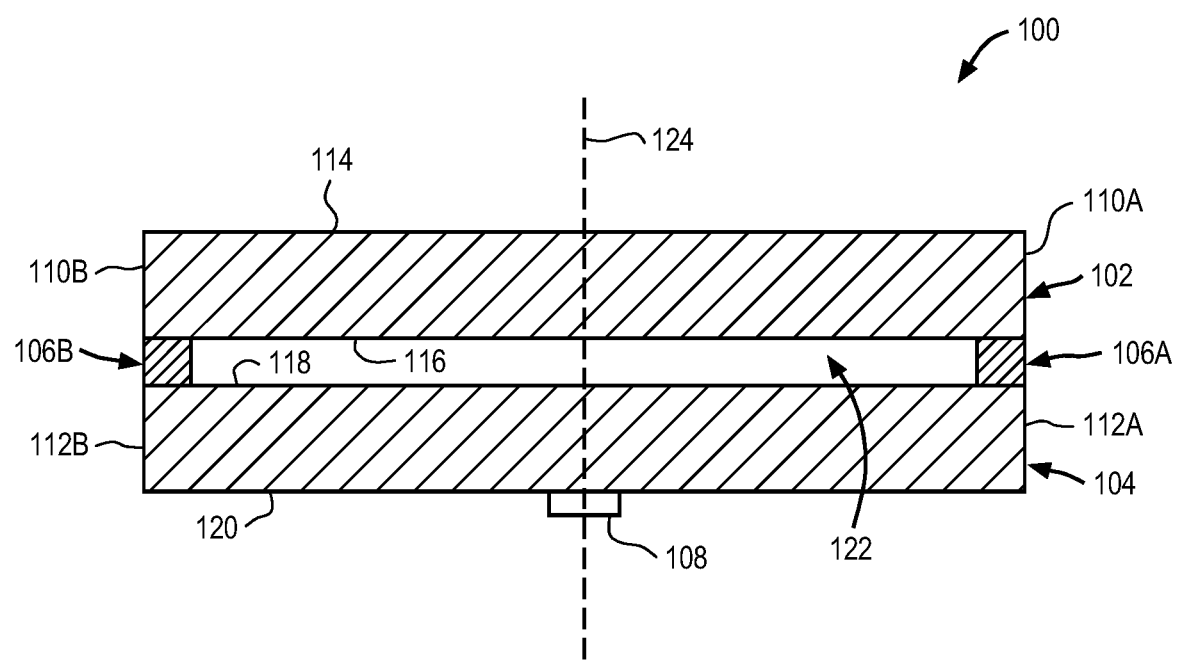
FIG. 1 illustrates a cross-sectional side view of a piezoelectric actuator unit.

FIG. 1 illustrates a cross-sectional side view of one aspect of a piezoelectric actuator unit. Piezoelectric actuator unit 100 may include a first piezoelectric bimorph beam 102 and a second piezoelectric bimorph beam 104. First piezoelectric bimorph beam 102 may have a top side 114 and a bottom side 116 which extend between a first end 110A and a second end 110B. Similarly, second piezoelectric bimorph beam 104 may have a top side 118 and a bottom side 120 which extend between first end 112A and second end 112B. First piezoelectric bimorph beam 102 may be considered stacked on top of second piezoelectric bimorph beam 104 such that sides 116 and 118 are interfacing (although not directly touching), and sides 114 and 120 face away from each other. In this aspect, the first piezoelectric bimorph beam 102 may also be referred to as an upper piezoelectric bimorph beam and the second piezoelectric bimorph beam 104 may be referred to as a lower piezoelectric bimorph beam. The respective ends 110A, 110B, 112A, 112B of each beam are attached to one another by joints 106A, 106B. For example, when the beams 102, 104 are stacked as shown, first end 110A of first piezoelectric bimorph beam 102 is connected by joint 106A to first end 112A of second piezoelectric bimorph beam 104, and second end 110B of first piezoelectric bimorph beam 102 is connected by joint 106B to second end 112B of second piezoelectric bimorph beam 104.

Figure 4:
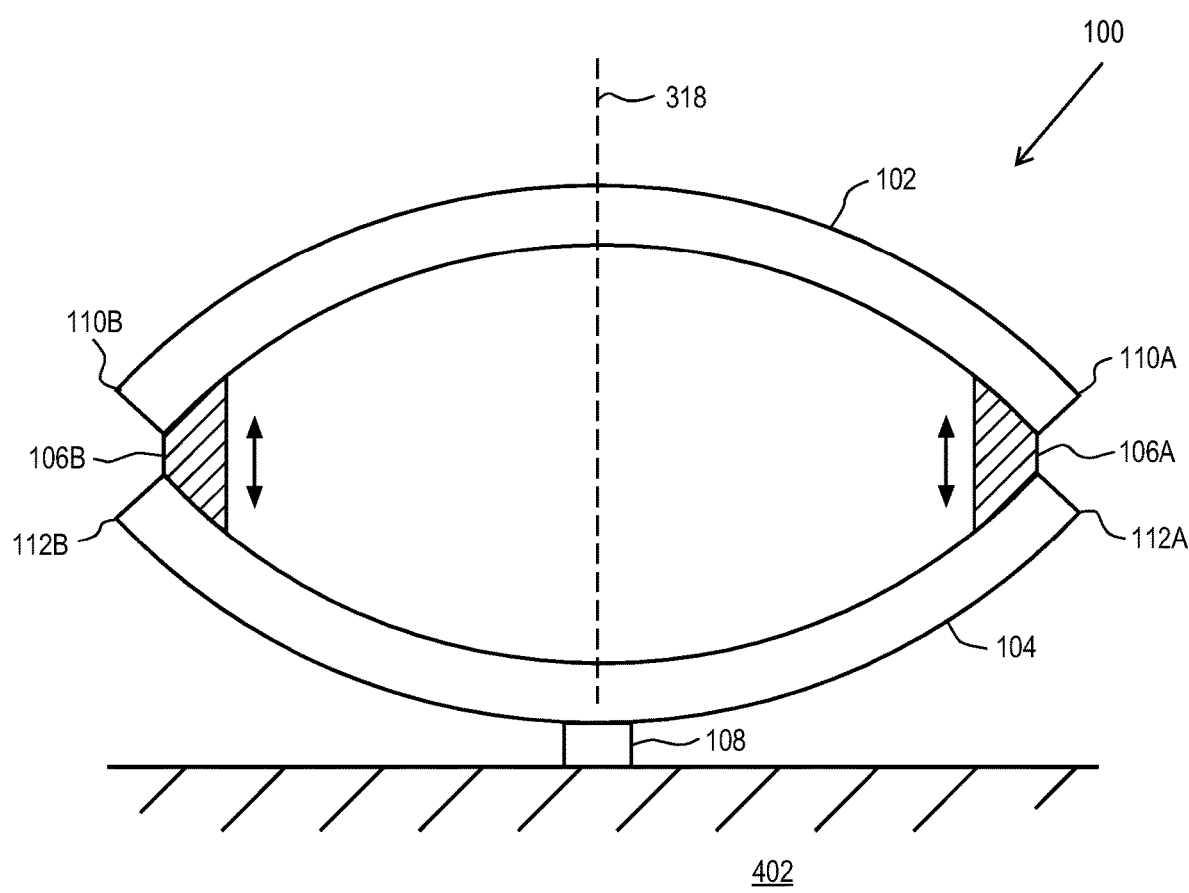
FIG. 4 illustrates a cross-sectional side view of a bending movement of the piezoelectric actuator unit of FIG. 1.

Joints 106A, 106B allow for rotation of the ends of first and second piezoelectric bimorph beams 102 and 104, respectively, with respect to one another as shown in FIG. 4. Joints 106A, 106B, however, should be resistant to compression and tension (e.g., horizontal stretching) such that the ends 110A, 110B, 112A, 112B of first piezoelectric bimorph beam 102 and second piezoelectric bimorph beam 104 do not slide or otherwise move horizontally with respect to one another. Representatively, in one aspect, each of joints 106A, 106B may be formed by a glue, adhesive, epoxy or the like, which secures only the beam ends along the interfacing sides 116, 118. For example, joints 106A, 106B may be formed by a line of a pressure sensitive adhesive (PSA) applied in a widthwise direction on sides 116, 118, at only the beam ends so that an open space or gap 122 is formed between the remaining portions of sides 116, 118. Representatively, the PSA may be applied at a minimal thickness, for example, a thickness of 200 microns or less, such that a height (in the z direction) of the gap 122 is 200 microns or less. In addition, the PSA may be as narrow as possible, for example, the PSA may essentially be a line running in a widthwise direction across the beams. For example, a line having a width of ½ mm or less. The remaining area of gap 122 between the joints 106A, 106B is open. In addition, it is noted that so as not to take away, or otherwise reduce, a compliance of the stack up of beams 102, 104, there is no filler, or other similar stabilizing material, between sides 116, 118 of beams 102, 104, respectively.

Figure 2:
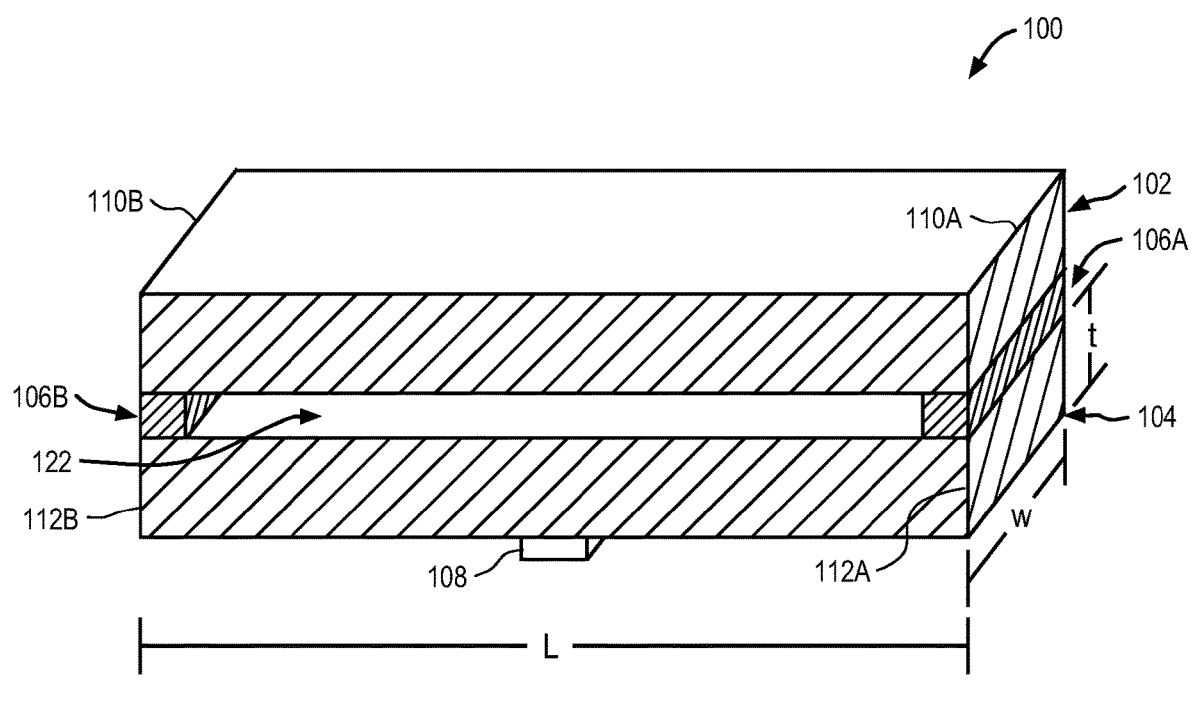
FIG. 2 illustrates a perspective view of the piezoelectric actuator unit of FIG. 1.

This arrangement of first piezoelectric bimorph beam 102, second piezoelectric bimorph beam 104 and joints 106A, 106B can be more clearly seen in the perspective view of actuator 100 illustrated in FIG. 2. In particular, from this view, it can be seen that beams 102, 104 have a length (L), a width (W) and a thickness (T). Joints 106A, 106B are formed across the width (W) of beams 102, 104 in a relatively narrow line, and attach only the ends 110A, 110B, 112A, 112B together. In addition, it can be understood from FIG. 2 that the ends 110A, 110B, 112A, 112B that are attached together at joints 106A, 106B are the ends defining the length dimension (L) of each beam. In other words, it is the ends of each beam that are farthest apart that are attached together, therefore most of the beam is free to move.

Returning now to FIG. 1, piezoelectric actuator unit 100 may further include a base member 108. Base member 108 may be a substantially rigid structure that can be used to connect the piezoelectric actuator unit 100 to another structure (e.g., another actuator unit or stationary structure). For example, the base member 108 may be considered "rigid" in that it is less compliant (or more stiff) than the second piezoelectric bimorph beam 104. The base member 108 may provide the only connection point between the piezoelectric actuator unit 100 and another structure. In FIG. 1, base member 108 is shown attached (e.g. chemically or mechanically mounted) to second piezoelectric bimorph beam 104, at side 120, which faces away from first piezoelectric bimorph beam 102. In other aspects, however, base member 108 could be attached to first piezoelectric bimorph beam 102, for example, at side 114. Still further, it is contemplated that base member 108 could be part of the structure that the unit 100 is coupled to, and could be any type of supporting structure that supports unit 100 on the structure such that the upper and lower beams do not contact the supporting structure anywhere except at the base member 108.

Base member 108 is attached to the beam 104 (or beam 102) at its center 124, and should generally be in contact with only a small fraction of the length of the lower beam 104 to avoid stiffening the beam vs. flapping. Base member 108 can, however, contact the full width of the beam to increase stiffness v. translation of the center. For example, base member 108 may be an elongated, beam like structure that extends along center 124, in a widthwise direction across side 120, of beam 104, as shown in FIG. 2. In this aspect, when base member 108 is used to attach piezoelectric actuator unit 100 to another structure, the center portion of beam 104 may remain relatively stationary with respect to the structure, while the ends 112A, 112B of beam 104 are free to move with respect to the structure. For example, when a voltage is applied, ends 112A, 112B of beam 104 can move away from the structure as illustrated in FIG. 4.

Referring again to FIG. 2, it should be noted that in one aspect, piezoelectric beam 102 and piezoelectric beam 104 may have a same thickness (T) as shown. In addition, each of beams 102 and 104 may have a same width (W) and length (L). In this aspect, each of beams 102 and 104 may be understood to have a same stiffness and/or piezoelectric material volume. Accordingly, when a voltage is applied, an amplitude of the bend or deflection of each of the beams 102 and 104 is substantially the same, as illustrated by FIG. 4.

Figure 3:
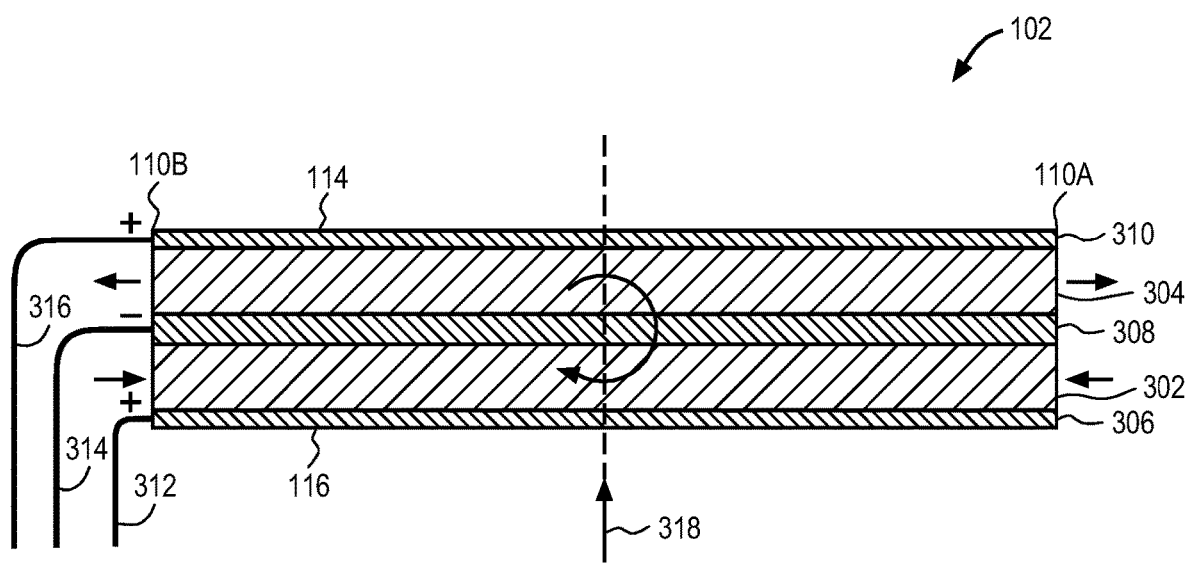
FIG. 3 illustrates a cross-sectional side view of a piezoelectric actuator beam of a piezoelectric actuator unit.

Referring now to FIG. 3, FIG. 3 illustrates a cross-sectional side view of one of the piezoelectric bimorph beams included in the actuator unit 100 of FIGS. 1-2. Representatively, FIG. 3 is a cross-sectional view of piezoelectric bimorph beam 102. It should be understood, however, that the description with respect to first piezoelectric bimorph beam 102, also applies to second piezoelectric bimorph beam 104. Piezoelectric bimorph beam 102 may include two piezoelectric layers 302, 304 running parallel to the length dimension of beam 102. The piezoelectric layers 302, 304 may be made of a piezoelectric material, for example, a ceramic. The piezoelectric layers 302, 304 may be sandwiched between conductive or electrode layers 306, 308, 310. Representatively, the piezoelectric bimorph beam 102 may include a stack up of electrode layer 306, piezoelectric layer 302, electrode layer 308, piezoelectric layer 304 and electrode layer 310, in that order. It should further be noted that the layers 302-310 are stacked directly on top of one another, and without any intervening substrate layers. It is further contemplated that although beam 102 is referred to herein as a piezoelectric bimorph beam 102, in some aspects, beam 102 could be any type of electroactive beam, for example, a multilayer plate bender.

In FIG. 3, piezoelectric layers 302, 304 are further shown arranged so that beam 102 has a polarization direction as illustrated by arrow 318 (e.g., in a 3 direction). When a signal or voltage is applied to electrode layers 306, 308, 310 (e.g., via circuitry or wires 312, 314, 316), an electric field is applied across the piezoelectric layers 302, 304 as shown. This electric field strains the piezoelectric layers 302, 304, for example, one layer is negatively strained and the other is positively strained. When this stress in the piezoelectric material acts in different directions (illustrated by the horizontal arrows), a bending moment is induced (illustrated by the curved arrow). Said another way, upon application of the voltage, the electric field causes piezoelectric layer 302 to contract inward, while piezoelectric layer 304 expands outward, causing beam 102 to bend. This bending of the beam 102 yields a relatively large displacement at the ends 110A, 110B of the beam (see, for example, FIG. 4).

As previously discussed, this relatively large displacement (e.g., vibration) allows piezoelectric bimorph beam 102 to be used in an actuator (e.g., actuator unit 100) where vibrations of a particular frequency or bandwidth, for example, an audio speaker driver, are desired. However, the force output of the beam for a given volume, compliance and electric field input may be limited to a theoretical maximum defined by the piezoelectric material. Modifying aspects of the piezoelectric material and/or beam can be used to modify the output. For example, increasing the beam compliance allow the beam to radiate low frequency sounds (e.g., 200 Hz or less). Where the volume of the bimorph beam 102 is fixed, increasing compliance means the beam must be made longer. A longer beam, however, is not necessarily desirable because this increases the overall foot print of the actuator in the x and/or y direction. Alternatively, the width or thickness of the beam can be increased to increase the piezoelectric material volume, but then this may reduce the compliance of the beam making a low frequency range difficult to achieve.

It should be further understood that if beam 102 is fixed at one end (e.g., to a fixed structure) and connected to a mass at another end (e.g, a moving structure), when it is actuated at different frequencies, there will be a relatively large peak in the frequency response curve representing a lot of sound/acceleration of the mass at the resonance of the beam. Modifying the dimensions of the piezoelectric material or beam (e.g., changing the length, width or thickness) can therefore also be used to tune a force output and/or resonant frequency. For example, if the length of the beam is increased, the resonance can be lowered because the stiffness of the beam is decreased. This, however, may reduce the force output at higher frequencies. In addition, this increases the overall actuator foot print in the x and/or y directions making the actuator unsuitable for implementation in enclosures having a small form factor.

Piezoelectric actuator unit 100 solves many of these challenges by stacking piezoelectric bimorph beam 102 with one or more other beams (e.g., beam 104). Stacking beams 102 and 104 as disclosed herein increases displacement, while still achieving a high force output and maintaining a relatively small foot print (in the x and y dimensions). In particular, the stiffness decreases as the number of layers of bimorph beams increases. Said another way, the stiffness can be divided by the number of layers of bimorphs in the structure. Thus, the more beams that are stacked together, the more the compliance increases, and this in turn, leads to an increase in the displacement that can be achieved. In addition, as illustrated by FIG. 2, since beams 102 and 104 are stacked as shown, only the overall height (e.g. z-height or dimension along the z-axis) of the piezoelectric actuator unit 100 increases, while the overall length (L) (e.g., dimension along the x-axis) and width (W) (e.g., dimension along the y-axis) can remain the same. Thus, this increased displacement is achieved while still maintaining a same overall actuator footprint (in the x and y dimensions).

FIG. 4 illustrates one aspect of a deflection or displacement that can be achieved by the piezoelectric actuator unit 100. Representatively, FIG. 4 illustrates actuator unit 100 attached to a structure 402 by base member 108. When a voltage is applied, first and second piezoelectric bimorph beams 102, 104, respectively, bend in different directions. For example, ends 112A, 112B of second piezoelectric bimorph beam 104 bend upward, and ends 110A, 110E of first piezoelectric bimorph beam 102 bend downward such that the centers of each beam are farther apart. In addition, the amplitude of the displacement (or bend) of first piezoelectric bimorph beam 102 and second piezoelectric bimorph beam 104 alone may be substantially the same. The overall displacement of piezoelectric actuator unit 100, however, may be greater than a single bimorph beam alone. For example, a displacement of the top side 114 of beam 102 may be the sum of the displacement of beams 102 and 104 combined. In addition, since the additional beams do not increase the overall stiffness, and in fact it is decreased (e.g., compliance is increased), the actuator 100 is suitable for low frequency applications, and without compromising the output force.

It should further be understood that characteristics of the joints 106A, 106B, which are used to attach first and second piezoelectric bimorph beams 102, 104 together, may also be critical to maintaining a desired force output. In particular, as previously discussed, joints 106A, 106B are low-rotational-stiffness joints. In other words, joints 106A, 106B are designed to allow for rotation of the ends of beams 102 and 104 with respect to one another, but resistant (or stiff) to compression and tension. For example, as can be seen from FIG. 4, joints 106A, 106B can stretch vertically (in a triangular fashion) to allow for rotation of ends 110A, 112A and ends 110B, 112B, with respect to one another, much like they were rotating around a pin. Joints 106A, 106B, however, maintain relatively the same width (e.g., resistant to stretching in a horizontal direction) because they are resistant to tension and sheer. This low-rotational-stiffness at joints 106A, 106B allows each of beams 102, 104 to deflect without adding unnecessary stiffness. In addition, the high out-of-plane stiffness (e.g., resistant to stretch in the horizontal direction) reduces force loss at the joint.

Still further, it should be understood that joints 106A, 106B only attach ends 110A, 110B, 112A, 112B (e.g. the short ends) of each of beams 102, 104 together. The remaining sides, edges and/or surfaces of beams 102, 104 are not connected and are free to move with respect to one another, which further reduces any unnecessary stiffness.

Figure 5:
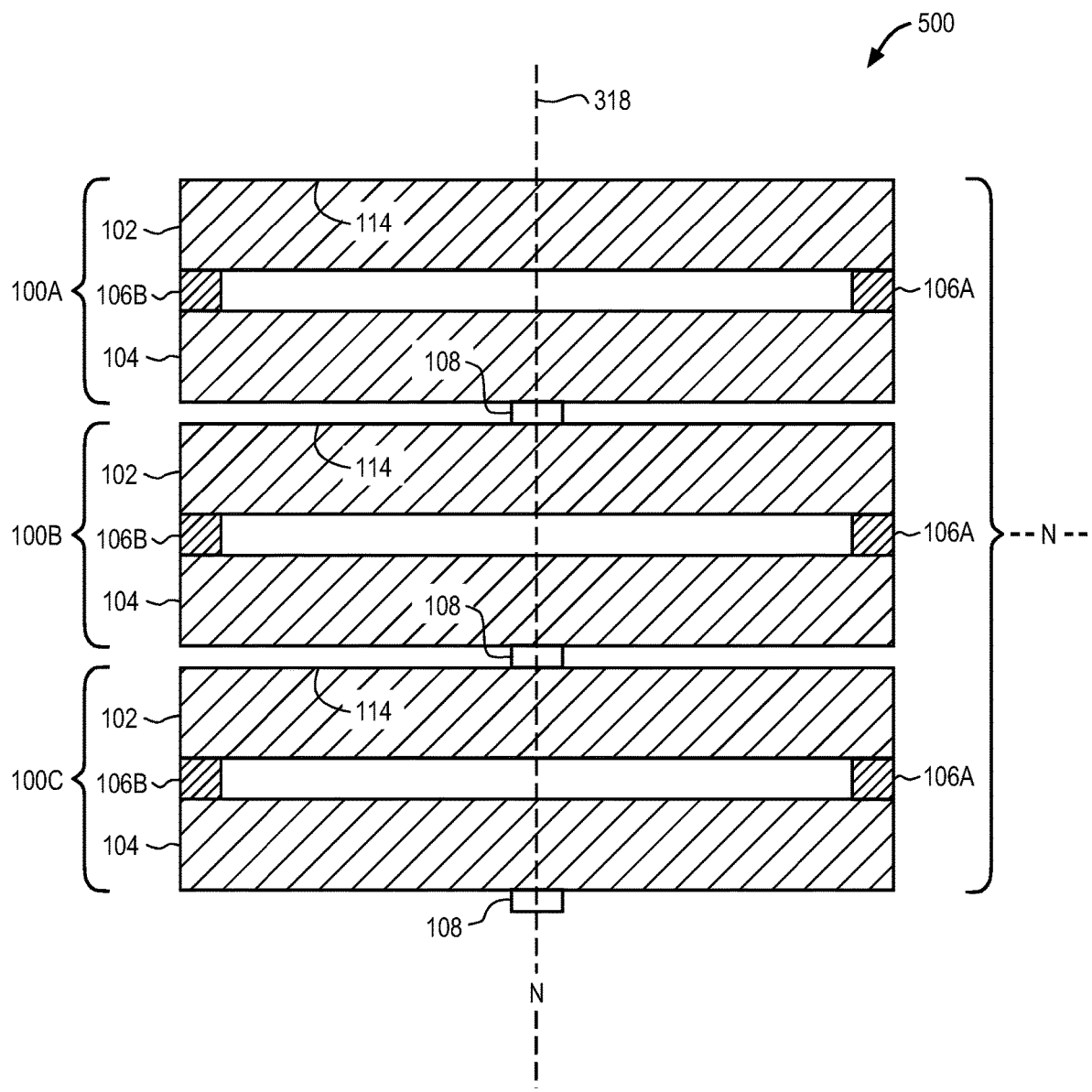
FIG. 5 illustrates a cross-sectional side view of a composite piezoelectric actuator unit.

While FIGS. 1-4 illustrate two piezoelectric bimorph beams 102, 104 symmetrically arranged to form a piezoelectric actuator unit 100 with increased displacement, an actuator with even greater displacement and/or force output (and without increasing x and y dimensions) can be achieved by symmetrically arranging more than one of piezoelectric actuator units 100 together. FIG. 5 illustrates a cross-sectional side view of a composite piezoelectric actuator unit 500 made up of a number of piezoelectric actuator units 100A 100B and 100C. Piezoelectric actuator units 100A, 100B and 100C may be substantially the same as piezoelectric actor unit 100 previously discussed in reference to FIGS. 1-4. The piezoelectric actuator units 100A-100C are stacked to form a symmetrical structure (e.g., along axis 318) as shown. For example, piezoelectric actuator units 100A-100C are stacked such that the base member 108 of unit 100A is connected to the top side 114 of second piezoelectric beam 104 of unit 100B, and base member 108 of unit 100B is connected to the top side 114 of first piezoelectric beam 104 of unit 100C. It should be recognized that the only point of connection between each of units 100A-100C may be at base members 108 as shown. In this aspect, a displacement of each of units 100A-100C can be maximized upon application of a voltage or signal. The voltage or signal may be the same for all units, such that, for example, all the units 100A-100C are driven at the same time. When arranged as shown, the displacement of the top side 114 of the upper most piezoelectric beam of the stack (e.g., beam 104 of unit 100A) is displaced by the sum of the displacements of all the underlying units (e.g., units 100B and 100C). In this aspect, a composite piezoelectric actuator unit 500 having an increased piezoelectric material volume, and therefore increased force output, without increasing an overall footprint (e.g., an x and y dimension) can be achieved.

It should further be understood that although units 100A-100C are shown stacked one on top of the other, any number of units 100 may be arranged together along an x, y and/or z axis, where an even greater deflection and/or force output is desired. For example, N number of units 100 may be stacked one on top of the other (e.g., along a z-axis or axis 318) and/or N number of units 100 may be arranged end to end (e.g., along an x-axis) and/or N number of units 100 may be arranged side by side (e.g., along a z-axis). Representatively, in one aspect, the composite unit 500 may include an arrangement of 8 side by side columns, each of the columns made up of 5 actuator units 100, each vertically stacked one on top of the other. Still further, composite unit 500 could include three or more of this composite arrangement (including the 8 columns), arranged end to end with one another. Representatively, in some aspects, the composite unit 500 may include 2 or more of units 100 symmetrically arranged, for example, 24 of units 100 symmetrically arranged, 40 of units 100 symmetrically arranged, 80 of units symmetrically arranged or 120 of units 100 symmetrically arranged. It should be understood that the symmetry provides better rigid connection by reducing the torque load on the joints.

Figure 6:
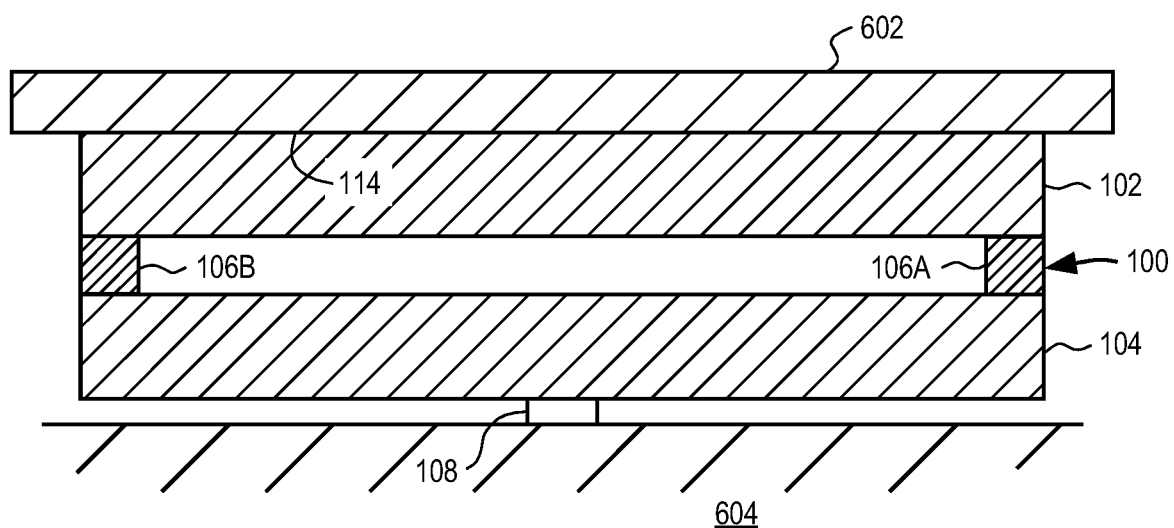
FIG. 6 illustrates a cross-sectional side view of one application for a piezoelectric actuator unit.

FIG. 6 illustrates a cross-sectional side view one exemplary application for a piezoelectric actuator unit. Representatively, FIG. 6 shows piezoelectric actuator unit 100 coupled to a moving structure 602 and a fixed structure 604. In this application, it is desirable to move the moving structure 602 with respect to the fixed structure 604. The moving structure 602 could be any type of structure or mass that is desired to be moved with respect to another structure. Similarly, the fixed structure 604 could be any type of structure that is to remain relatively stationary or fixed while another structure is moving. For example, the moving structure 602 could be an audio speaker diaphragm and the fixed structure 604 could be a fixed portion of the speaker (e.g., portion of the speaker module or enclosure). Still further, the moving structure 602 and the fixed structure 604 may be portions of an electronic device enclosure, for example, a top enclosure wall and a bottom enclosure wall, respectively, in which it is desirable to move (e.g., vibrate) one wall with respect to the other.

As shown in FIG. 6, the top wall 114 of piezoelectric actuator unit 100 is attached to moving structure 602, and the base member 108 is attached to fixed structure 604. When a voltage is applied to piezoelectric actuator unit 100, a displacement or vibration of unit 100, as previously discussed, causes a corresponding displacement or vibration of moving structure 602. Various aspects of the unit 100 can be tuned, as previously discussed, to cause the desired displacement or vibration of moving structure 602. In addition, it is contemplated that although a separate moving structure 602 is shown in FIG. 6, in some aspects, the moving member 602 may be omitted and instead the top wall 114 of piezoelectric actuator unit 100 may serve as the moving structure.

Still further, it should be understood that while FIG. 6 shows a single piezoelectric actuator unit 100 for driving moving structure 602, any number of piezoelectric actuator units 100 may be used. For example, a composite piezoelectric actuator unit such as unit 500 described in reference to FIG. 5 may be used to drive movement of moving structure 602.

Figure 7:
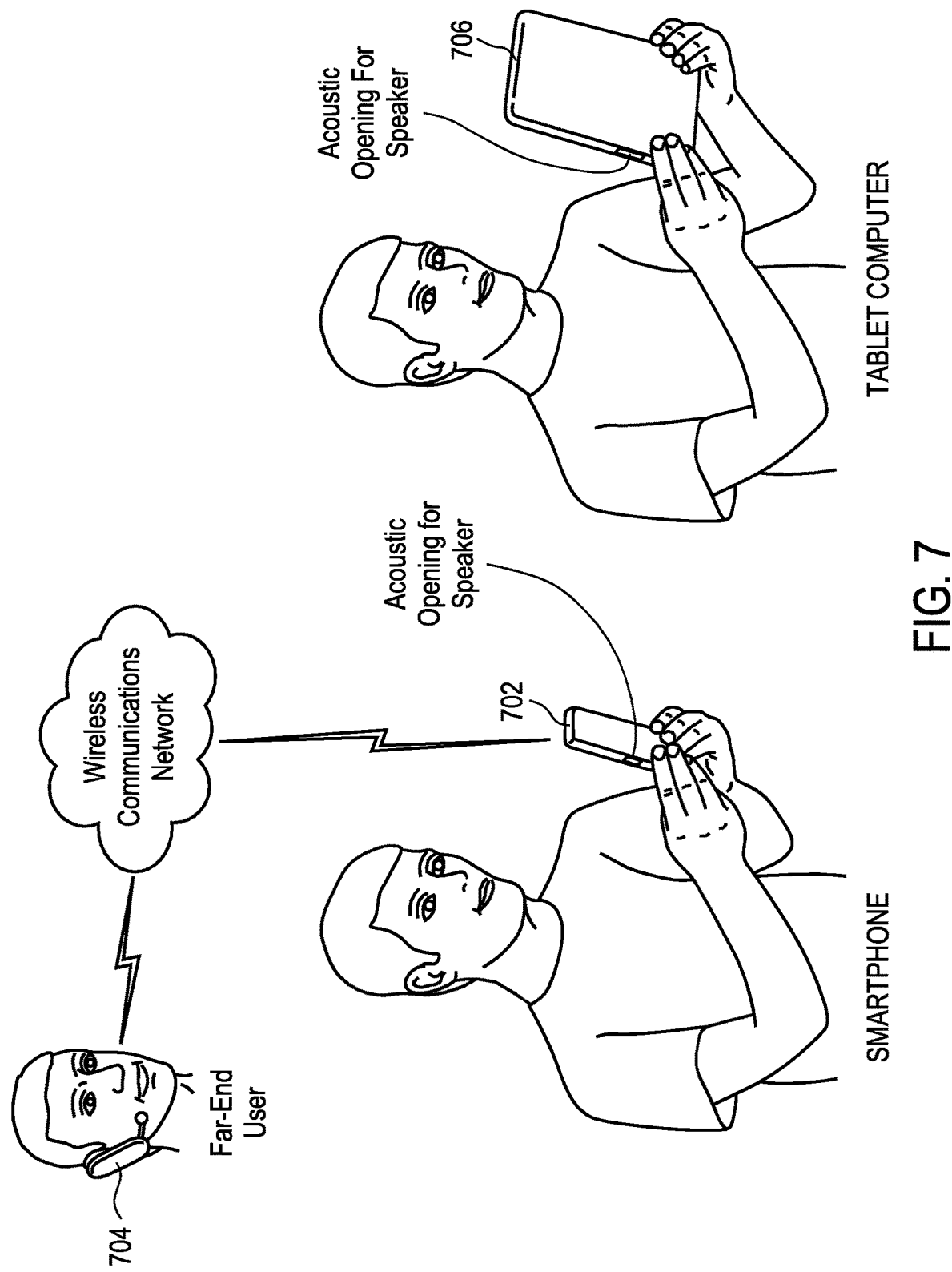
FIG. 7 illustrates a simplified schematic view of an electronic device in which a piezoelectric actuator unit may be implemented.

FIG. 7 illustrates a simplified schematic perspective view of an exemplary electronic device in which a composite piezoelectric actuator as described herein, may be implemented. As illustrated in FIG. 7, the composite piezoelectric actuator may be integrated within a consumer electronic device 702 such as a smart phone with which a user can conduct a call with a far-end user of a communications device 704 over a wireless communications network; in another example, the composite piezoelectric actuator may be integrated within the housing of a tablet computer 706. These are just two examples of where the composite piezoelectric actuator described herein may be used; it is contemplated, however, that the composite piezoelectric actuator may be used with any type of electronic device in which movement of a mass is desired, for example, a home audio system, any consumer electronics device with audio capability, or an audio system in a vehicle (e.g., an automobile infotainment system).

Figure 8:
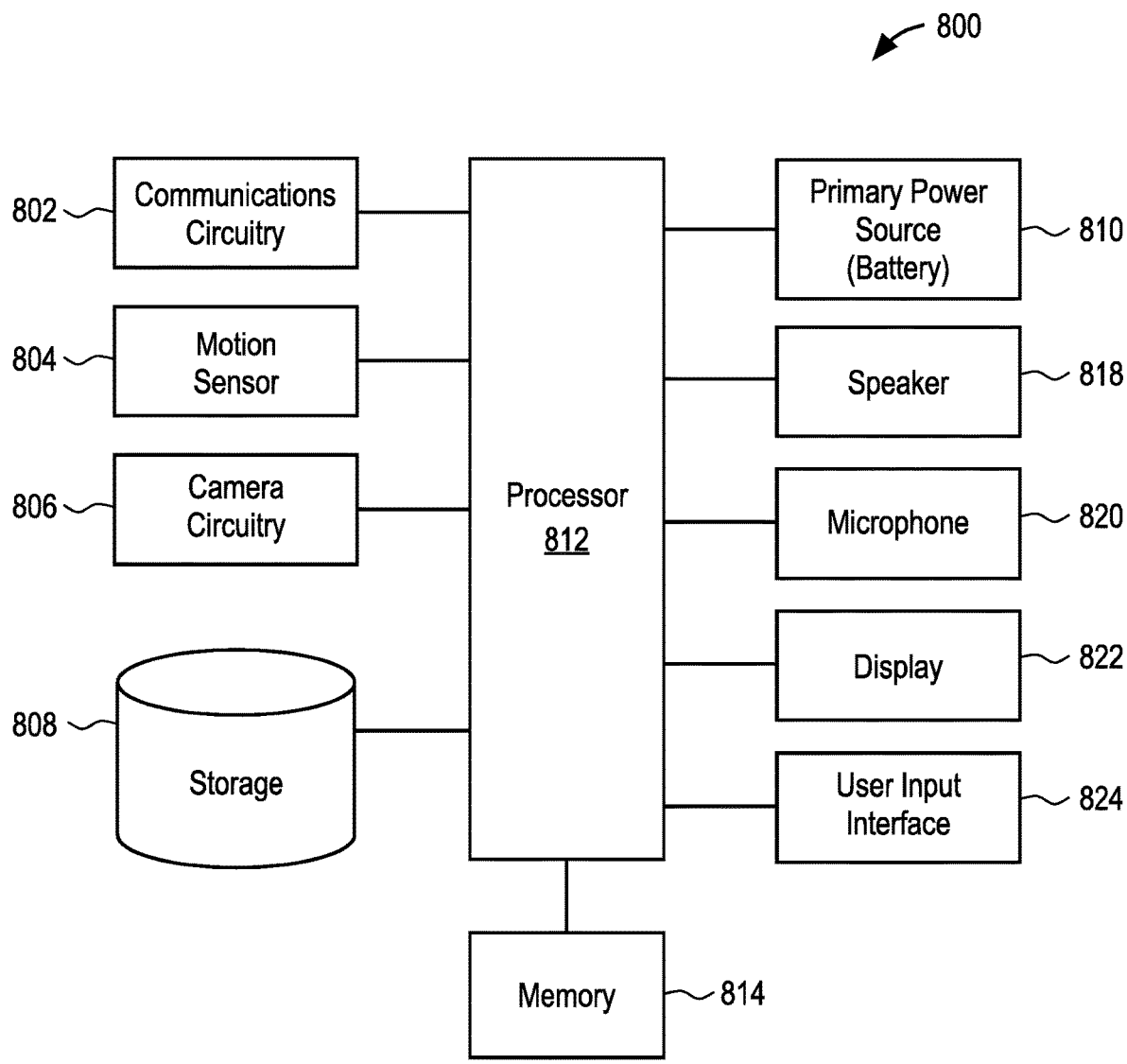
FIG. 8 illustrates a block diagram of some of the constituent components of an electronic device in which a piezoelectric actuator unit may be implemented.

FIG. 8 illustrates a block diagram of some of the constituent components of an electronic device in which the composite piezoelectric actuator disclosed herein may be implemented. Device 800 may be any one of several different types of consumer electronic devices, for example, any of those discussed in reference to FIG. 8.

In this aspect, electronic device 800 includes a processor 812 that interacts with camera circuitry 806, motion sensor 804, storage 808, memory 814, display 822, and user input interface 824. Main processor 812 may also interact with communications circuitry 802, primary power source 810, speaker 818 and microphone 820. Speaker 818 may be a micro speaker assembly within which the piezoelectric actuator unit 100 is implemented. The various components of the electronic device 800 may be digitally interconnected and used or managed by a software stack being executed by the processor 812. Many of the components shown or described here may be implemented as one or more dedicated hardware units and/or a programmed processor (software being executed by a processor, e.g., the processor 812).

The processor 812 controls the overall operation of the device 800 by performing some or all of the operations of one or more applications or operating system programs implemented on the device 800, by executing instructions for it (software code and data) that may be found in the storage 808. The processor 812 may, for example, drive the display 822 and receive user inputs through the user input interface 824 (which may be integrated with the display 822 as part of a single, touch sensitive display panel). In addition, processor 812 may send an audio signal to speaker 818 to facilitate operation of speaker 818.

Storage 808 provides a relatively large amount of "permanent" data storage, using nonvolatile solid state memory (e.g., flash storage) and/or a kinetic nonvolatile storage device (e.g., rotating magnetic disk drive). Storage 808 may include both local storage and storage space on a remote server. Storage 808 may store data as well as software components that control and manage, at a higher level, the different functions of the device 800.

In addition to storage 808, there may be memory 814, also referred to as main memory or program memory, which provides relatively fast access to stored code and data that is being executed by the processor 812. Memory 814 may include solid state random access memory (RAM), e.g., static RAM or dynamic RAM. There may be one or more processors, e.g., processor 812, that run or execute various software programs, modules, or sets of instructions (e.g., applications) that, while stored permanently in the storage 808, have been transferred to the memory 814 for execution, to perform the various functions described above.

The device 800 may include communications circuitry 802. Communications circuitry 802 may include components used for wired or wireless communications, such as two-way conversations and data transfers. For example, communications circuitry 802 may include RF communications circuitry that is coupled to an antenna, so that the user of the device 800 can place or receive a call through a wireless communications network. The RF communications circuitry may include a RF transceiver and a cellular baseband processor to enable the call through a cellular network. For example, communications circuitry 802 may include Wi-Fi communications circuitry so that the user of the device 800 may place or initiate a call using voice over Internet Protocol (VOIP) connection, transfer data through a wireless local area network.

The device may include a speaker 818. Speaker 818 may be a speaker which includes an actuator, such as that described in reference to FIG. 1. Speaker 818 may be an electric-to-acoustic transducer or sensor that converts an electrical signal input (e.g., an acoustic input) into sound. The circuitry 312-316 of FIG. 3 may be electrically connected to processor 812 and power source 810 to facilitate the speaker operations, including diaphragm displacement measurement and temperature compensation as previously discussed.

The device 800 may further include a motion sensor 804, also referred to as an inertial sensor, that may be used to detect movement of the device 800, camera circuitry 806 that implements the digital camera functionality of the device 800, and primary power source 810, such as a built in battery, as a primary power supply.

While certain aspects have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, in one aspect, the piezoelectric bimorph beams, piezoelectric actuator unit and/or composite piezoelectric actuator unit disclosed herein may be considered 3-1 bimorph actuators in that electric field is in the 3 direction (e.g., direction parallel to a z-axis) and the beam expansion is in the 1 direction (e.g., direction parallel to an x-axis). In other aspects, however, the piezoelectric bimorph beams, piezoelectric actuator unit and/or composite piezoelectric actuator unit may be arranged so that the expansion is in a same direction as the electric field, in other words the expansion is in the 3 direction or direction parallel to a z-axis, and may therefore be considered 3-3 bimorph actuators. Moreover, the devices and processing steps disclosed herein may correspond to any type of electromechanical actuator and any application including, but not limited to, an actuator for moving one part with respect to another, for example to reproduce audio sound, for example in a home audio system, any consumer electronics device with audio capability, or an audio system in a vehicle (e.g., an automobile infotainment system). The description is thus to be regarded as illustrative instead of limiting. In addition, to aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

What is claimed is:

1. A piezoelectric actuator comprising:
an upper piezoelectric bimorph beam, the upper piezoelectric bimorph beam having a first upper piezoelectric layer, a second upper piezoelectric layer and at least three upper electrode layers extending between a first end and a second end of the upper piezoelectric bimorph beam, and wherein at least one of the three upper electrode layers is directly coupled to the first upper piezoelectric layer and the second upper piezoelectric layer; and
a lower piezoelectric bimorph beam coupled to the upper piezoelectric bimorph beam, the lower piezoelectric bimorph beam having a first lower piezoelectric layer, a second lower piezoelectric layer and at least three lower electrode layers extending between a first end and a second end of the lower piezoelectric bimorph beam, and wherein at least one of the three lower electrode layers is directly coupled to the first lower piezoelectric layer and the second lower piezoelectric layer, and wherein the first end of the lower piezoelectric bimorph beam is coupled to the first end of the upper piezoelectric bimorph beam by a first joint, and the second end of the lower piezoelectric bimorph beam is coupled to the second end of the upper piezoelectric bimorph beam by a second joint.

2. The piezoelectric actuator of claim 1 further comprising:
a base member coupled to a center region of the lower piezoelectric bimorph beam along a side of the lower piezoelectric bimorph beam facing away from the upper piezoelectric bimorph beam, the base member is dimensioned to couple the lower piezoelectric bimorph beam to a structure, and when coupled, the first and second ends of the upper and lower piezoelectric bimorph beams are operable to move relative to the structure.

3. The piezoelectric actuator of claim 1 wherein each of the upper piezoelectric bimorph beam and the lower piezoelectric bimorph beam have a same stiffness.

4. The piezoelectric actuator of claim 1 wherein the upper piezoelectric bimorph beam and the lower piezoelectric bimorph beam bend in opposite directions upon application of a voltage.

5. The piezoelectric actuator of claim 1 wherein the first joint and the second joint are dimensioned to be compliant to a rotational movement of the upper piezoelectric bimorph beam relative to the lower piezoelectric bimorph beam, and resistant to compression and tension.

6. The piezoelectric actuator of claim 5 wherein at least one of the first joint and the second joint comprise a pressure sensitive adhesive.

7. The piezoelectric actuator of claim 1 wherein a gap in the range of 300 microns or less is present between the upper piezoelectric bimorph beam and the lower piezoelectric bimorph beam.

8. The piezoelectric actuator of claim 7 wherein the gap is an open space free of a filler material.

9. The piezoelectric actuator of claim 1 wherein the lower piezoelectric bimorph beam is coupled to a fixed structure by a base member that serves as an only point of contact between the lower piezoelectric bimorph beam and the fixed structure, the upper piezoelectric bimorph beam is coupled to a movable structure, and upon application of a voltage, the movable structure produces a sound output within a low frequency range.

10. A composite piezoelectric actuator comprising:
an upper piezoelectric actuator unit comprising a first upper piezoelectric bimorph beam and a second upper piezoelectric bimorph beam, the first and second upper piezoelectric bimorph beams are attached to each other at each of their respective ends by a joint directly connecting a conductive layer at each of their respective ends that allows for a rotational movement of the first upper piezoelectric bimorph beam relative to the second upper piezoelectric bimorph beam, and a base member is mounted to a center portion of the second upper piezoelectric bimorph beam along a side that faces away from the first upper piezoelectric bimorph beam; and a lower piezoelectric actuator unit coupled to the upper piezoelectric actuator unit, the lower piezoelectric actuator unit comprising a first lower piezoelectric bimorph beam and a second lower piezoelectric bimorph beam, the first and second lower piezoelectric bimorph beams are attached to each other at each of their respective ends by a joint directly connecting a conductive layer at each of their respective ends that allows for a rotational movement of the first lower piezoelectric bimorph beam relative to the second lower piezoelectric bimorph beam, and a center portion of the first lower bimorph beam is mounted to the base member.

11. The composite piezoelectric actuator of claim 10 wherein at least one of the first upper piezoelectric bimorph beam, the second upper piezoelectric bimorph beam, the first lower piezoelectric bimorph beam or the second lower piezoelectric bimorph beam comprises a stack up of a first electrode layer, a first piezoelectric layer, a second electrode layer, a second piezoelectric layer and a third electrode layer.

12. The composite piezoelectric actuator of claim 10 wherein the upper piezoelectric actuator unit and the lower piezoelectric actuator unit are mounted together at only the base member.

13. The composite piezoelectric actuator of claim 10 wherein the upper piezoelectric actuator unit and the lower piezoelectric actuator unit are symmetrically arranged.

14. The composite piezoelectric actuator of claim 10 wherein a plurality of the upper piezoelectric actuator units and a plurality of the lower piezoelectric actuator units are symmetrically coupled together to achieve a desired force output without increasing an x and y dimension of the composite piezoelectric actuator unit.

15. The composite piezoelectric actuator of claim 10 wherein application of a voltage causes a displacement of the upper piezoelectric actuator unit that is equal to a sum of a displacement of the upper piezoelectric actuator unit and the lower piezoelectric actuator unit combined.

16. A piezoelectric actuator comprising:
a movable member;
a first piezoelectric bimorph beam having a first piezoelectric layer and a second piezoelectric layer that are arranged between electrode layers extending from a first end to a second end of the first piezoelectric bimorph beam, and at least one of the electrode layers is directly coupled to the first piezoelectric layer and the second piezoelectric layer, wherein the first piezoelectric bimorph beam is coupled to the movable member;
a second piezoelectric bimorph beam having a first piezoelectric layer and a second piezoelectric layer that are arranged between electrode layers extending from a first end to a second end of the second piezoelectric bimorph beam, and at least one of the electrode layers is directly coupled to the first piezoelectric layer and the second piezoelectric layer, and wherein the first and second ends of the second piezoelectric bimorph beam are coupled to the first and second ends of the first piezoelectric bimorph beam, respectively, by a joint that allows for a rotational movement of the first and second piezoelectric bimorph beams relative to each other;
a base member coupled to a center portion of the second piezoelectric bimorph beam along a side of the second piezoelectric bimorph beam facing away from the first piezoelectric bimorph beam; and a fixed member coupled to the base member, and wherein the first and second piezoelectric bimorph beams are operable to move the movable member relative to the fixed member upon application of a voltage.

17. The piezoelectric actuator of claim 16 wherein the first and second piezoelectric bimorph beams have a same thickness, length and width.

18. The piezoelectric actuator of claim 16 wherein the joint comprises an adhesive running in a widthwise direction between the first and second ends of the first and second piezoelectric bimorph beams, and the adhesive provides an only attachment point between the first and second piezoelectric bimorph beams.

19. The piezoelectric actuator of claim 16 wherein the base member is a rigid base member having a compliance that is less than a compliance of the second piezoelectric bimorph beam, and the rigid base member provides the only attachment point between the second piezoelectric bimorph beam and the fixed member.

20. The piezoelectric actuator of claim 16 wherein the movable member is a speaker diaphragm and upon application of a voltage, displacement of the first and second piezoelectric bimorph beams cause the speaker diaphragm to generate a sound output within a low resonance frequency.

21. An electronic device comprising:
an enclosure defining an enclosed space;
an upper piezoelectric bimorph beam positioned within the enclosed space, the upper piezoelectric bimorph beam having a first upper piezoelectric layer, a second upper piezoelectric layer and at least three upper electrode layers extending between a first end and a second end of the upper piezoelectric bimorph beam, and wherein at least one of the three upper electrode layers is directly coupled to the first upper piezoelectric layer and the second upper piezoelectric layer; and
a lower piezoelectric bimorph beam coupled to the upper piezoelectric bimorph beam, the lower piezoelectric bimorph beam having a first lower piezoelectric layer, a second lower piezoelectric layer and at least three lower electrode layers extending between a first end and a second end of the lower piezoelectric bimorph beam, and wherein at least one of the three lower electrode layers is directly coupled to the first lower piezoelectric layer and the second lower piezoelectric layer, and wherein the first end of the lower piezoelectric bimorph beam is coupled to the first end of the upper piezoelectric bimorph beam by a first joint, and the second end of the lower piezoelectric bimorph beam is coupled to the second end of the upper piezoelectric bimorph beam by a second joint.

22. The electronic device of claim 21 further comprising:
a base member coupled to a center region of the lower piezoelectric bimorph beam along a side of the lower piezoelectric bimorph beam facing away from the upper piezoelectric bimorph beam, the base member is dimensioned to couple the lower piezoelectric bimorph beam to the enclosure, and when coupled, the first and second ends of the upper and lower piezoelectric bimorph beams are operable to move relative to the structure.

23. The electronic device of claim 21 wherein each of the upper piezoelectric bimorph beam and the lower piezoelectric bimorph beam have a same stiffness.

24. The electronic device of claim 21 wherein the upper piezoelectric bimorph beam and the lower piezoelectric bimorph beam bend in opposite directions upon application of a voltage.

25. The electronic device of claim 21 wherein the first joint and the second joint are dimensioned to be compliant to a rotational movement of the upper piezoelectric bimorph beam relative to the lower piezoelectric bimorph beam, and resistant to compression and tension.

* * * * *